US008145460B2

(12) United States Patent
Fujiki

(10) Patent No.: US 8,145,460 B2
(45) Date of Patent: Mar. 27, 2012

(54) INFORMATION PROCESSING METHOD AND INFORMATION PROCESSING APPARATUS

(75) Inventor: Masakazu Fujiki, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 332 days.

(21) Appl. No.: 12/439,179

(22) PCT Filed: Aug. 28, 2007

(86) PCT No.: PCT/JP2007/067096
§ 371 (c)(1),
(2), (4) Date: Feb. 27, 2009

(87) PCT Pub. No.: WO2008/026752
PCT Pub. Date: Mar. 6, 2008

(65) Prior Publication Data
US 2009/0259443 A1 Oct. 15, 2009

(30) Foreign Application Priority Data

Aug. 31, 2006 (JP) ................... 2006-236757

(51) Int. Cl.
G06G 7/48 (2006.01)
(52) U.S. Cl. .......................... 703/7; 345/474
(58) Field of Classification Search .................. 703/1, 2, 703/6, 7; 345/473, 474, 958
See application file for complete search history.

(56) References Cited

U.S. PATENT DOCUMENTS

| 5,575,636 | A | | 11/1996 | Kobayashi | 431/8 |
|---|---|---|---|---|---|
| 5,640,335 | A | * | 6/1997 | Molvig et al. | 703/9 |
| 6,167,142 | A | | 12/2000 | Nozaki | |
| 6,664,965 | B1 | * | 12/2003 | Yamamoto et al. | 345/473 |
| 6,951,515 | B2 | * | 10/2005 | Ohshima et al. | 463/31 |
| 6,980,207 | B2 | * | 12/2005 | Yamamoto et al. | 345/419 |
| 7,191,104 | B2 | * | 3/2007 | Stewart et al. | 703/2 |
| 7,403,880 | B2 | * | 7/2008 | Maille et al. | 703/2 |
| 7,457,733 | B2 | * | 11/2008 | Maille et al. | 703/2 |
| 7,471,297 | B2 | * | 12/2008 | Yamamoto et al. | 345/473 |
| 7,663,629 | B2 | * | 2/2010 | Ajioka et al. | 345/473 |
| 7,689,683 | B2 | * | 3/2010 | Kato et al. | 709/223 |
| 2004/0104912 | A1 | * | 6/2004 | Yamamoto et al. | 345/473 |
| 2006/0192852 | A1 | * | 8/2006 | Rosenthal et al. | 348/61 |
| 2007/0006091 | A1 | * | 1/2007 | Sakagawa et al. | 715/771 |
| 2007/0167203 | A1 | * | 7/2007 | Yamada et al. | 463/7 |

FOREIGN PATENT DOCUMENTS

JP 08-005028 1/1996
(Continued)

OTHER PUBLICATIONS

Yokokohji et al, Y. Path Planning for Encountered-type Haptic Devices that Render Multiple Objects in 3D Space, IEEE, Virtual Reality, 2001, pp. 271-278.*

(Continued)

Primary Examiner — Russell Frejd
(74) Attorney, Agent, or Firm — Fitzpatrick, Cella, Harper & Scinto

(57) ABSTRACT

While a recording mode is being set, a manipulation log about a manipulation target virtual object is recorded in a memory (S301, S302). After the recording mode is canceled, a virtual element as a collision determination target with respect to the manipulation target virtual object is selected from a plurality of virtual elements existing in the same virtual space as the manipulation target virtual object based on the manipulation log (S303). Collision between the manipulation target virtual object and each of at least one selected virtual element is determined (S304). The collision determination result is output (S305).

17 Claims, 9 Drawing Sheets

FOREIGN PATENT DOCUMENTS

| | | |
|---|---|---|
| JP | 09-311883 | 12/1997 |
| JP | 10-307935 | 11/1998 |
| JP | 11-175573 | 2/1999 |
| JP | 11-184898 A | 7/1999 |
| JP | 2001-067381 A | 3/2001 |
| JP | 2002-304425 A | 10/2002 |
| JP | 2004-094750 | 3/2004 |

OTHER PUBLICATIONS

Jimenez et al, P. 3D Collision Detection: A Survey, Computers and Graphics, vol. 25, No. 2, Apr. 2001, pp. 269-285.*

Raabe et al, A. Space-Efficient FPGA-Accelerated Collision Detection for Virtual Prototyping, Design, Automation and Test in Europe, Mar. 2006, pp. 1-6.*

Benitez et al, A. Collision Detection using Sphere-tree Construction, 15th International Conference on Electronics, Communications and Computers, 2005, pp. 286-291.*

Zachmann, G. Rapid Collision Detection by Dynamically Aligned DOP-Trees, IEEE, Virtual Reality Annual International Symposium, 1998, pp. 90-97.*

Office Action which issued on Nov. 7, 2011, in counterpart Japanese patent application No. 2006-236757.

* cited by examiner

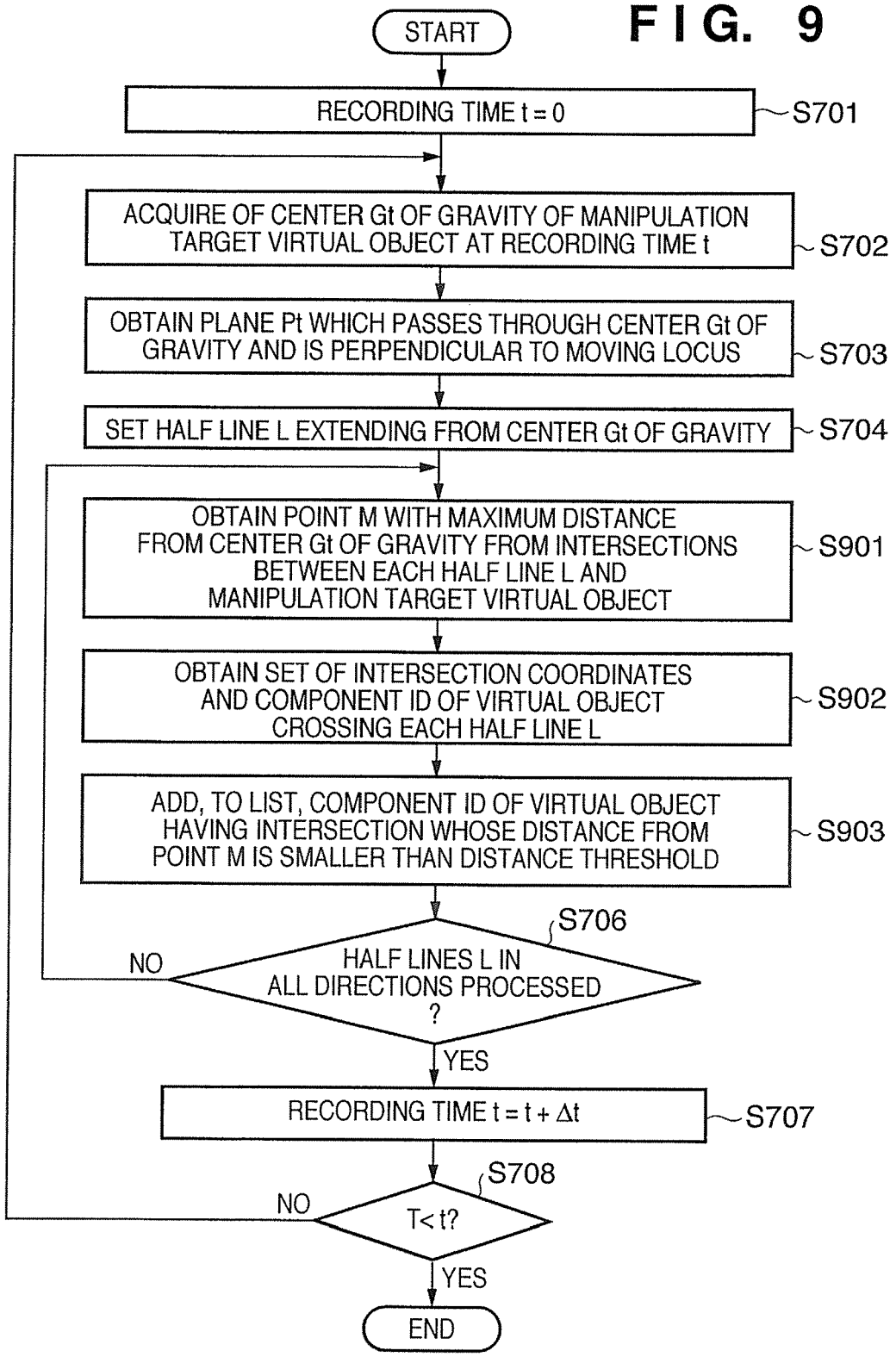

INFORMATION PROCESSING METHOD AND INFORMATION PROCESSING APPARATUS

TECHNICAL FIELD

The present invention relates to a collision determination technique and, more particularly, to a technique of determining collision between virtual objects.

BACKGROUND ART

There is conventionally a technique of simulating an operation such as assembly/disassembly of a machine in virtual three-dimensional space in a computer. This technique uses virtual object collision determination to detect contact between objects (Japanese Patent Laid-Open No. 9-311883).

Another technique changes the sequence of collision determination processing and preferentially processes a set of objects which have caused collision in the past, thereby speeding up the processing (Japanese Patent Publication No. 8-5028).

The collision determination processing determines the presence/absence of collision for each combination of geometric elements. For this reason, the processing time generally increases on the order of n! relative to an increase in the amount of data as a collision determination processing target.

The increase in processing time poses a serious problem particularly when operation simulation is done while interactively manipulating virtual objects by, for example, moving or rotating them. This is because if collision determination processing takes a long time, the objects manipulated by the operator cannot immediately react to the manipulation. Since the behavior of the objects largely differs from the physical world, it is impossible to achieve the purpose of simulating the physical world in itself.

For collision determination, it is sometimes necessary to rasterize, on a memory, data with a structure different from that of data for CG rendering in the virtual world. When the amount of data to be subjected to collision determination increases, the memory utilization considerably increases.

For example, Japanese Patent Publication No. 8-5028 discloses a technique of increasing the speed of collision determination processing by changing the sequence of geometric element combinations. However, the collision determination processing is time-consuming until the sequence change finishes. Additionally, this technique cannot solve the problem of heavy pressure on the memory space because it only changes the processing sequence and cannot reduce the amount of data.

DISCLOSURE OF INVENTION

The present invention has been made in consideration of the above-described problems, and has as its object to provide a technique of speeding up the process of determining collision between a manipulation target virtual object and another virtual object.

To achieve the above objects, according to an aspect of the present invention, there is provided an information processing method characterized by comprising:

a recording step of recording, in a memory, a manipulation log about a manipulation target virtual object while a recording mode is being set;

a selection step of selecting, on the basis of the manipulation log recorded in the recording step, a virtual element as a collision determination target with respect to the manipulation target virtual object from a plurality of virtual elements existing in the same virtual space as the manipulation target virtual object;

a collision determination step of determining collision between the manipulation target virtual object and each of at least one virtual element selected in the selection step; and a output step of outputting a result in the collision determination step.

According to another aspect of the present invention, there is provided an information processing apparatus characterized by comprising:

a recording unit adapted to record, in a memory, a manipulation log about a manipulation target virtual object while a recording mode is being set;

a selection unit adapted to select, on the basis of the manipulation log recorded by the recording unit, a virtual element as a collision determination target with respect to the manipulation target virtual object from a plurality of virtual elements existing in the same virtual space as the manipulation target virtual object;

a collision determination unit adapted to determine collision between the manipulation target virtual object and each of at least one virtual element selected by the selection unit; and an output unit adapted to output a result by the collision determination unit.

Further features of the present invention will become apparent from the following description of exemplary embodiments with reference to the attached drawings.

BRIEF DESCRIPTION OF DRAWINGS

FIG. 9 is a flowchart of a process in step S303 according to the second embodiment of the present invention.

BEST MODE FOR CARRYING OUT THE INVENTION

Preferred embodiments of the present invention will be described below in detail with reference to the accompanying drawings.

First Embodiment

In this embodiment, an operation of, for example, attaching a component to a machine is simulated in virtual space. A virtual object (manipulation target virtual object) corresponding to a component to be attached moves while maintaining a fixed relative position and orientation with respect to a sensor capable of measuring the position and orientation of its own in the three-dimensional physical world. For this reason, the operator can simulate an operation of moving/rotating the manipulation target virtual object by moving/rotating the sensor.

The outline of this embodiment will be described next.

Figure 1:
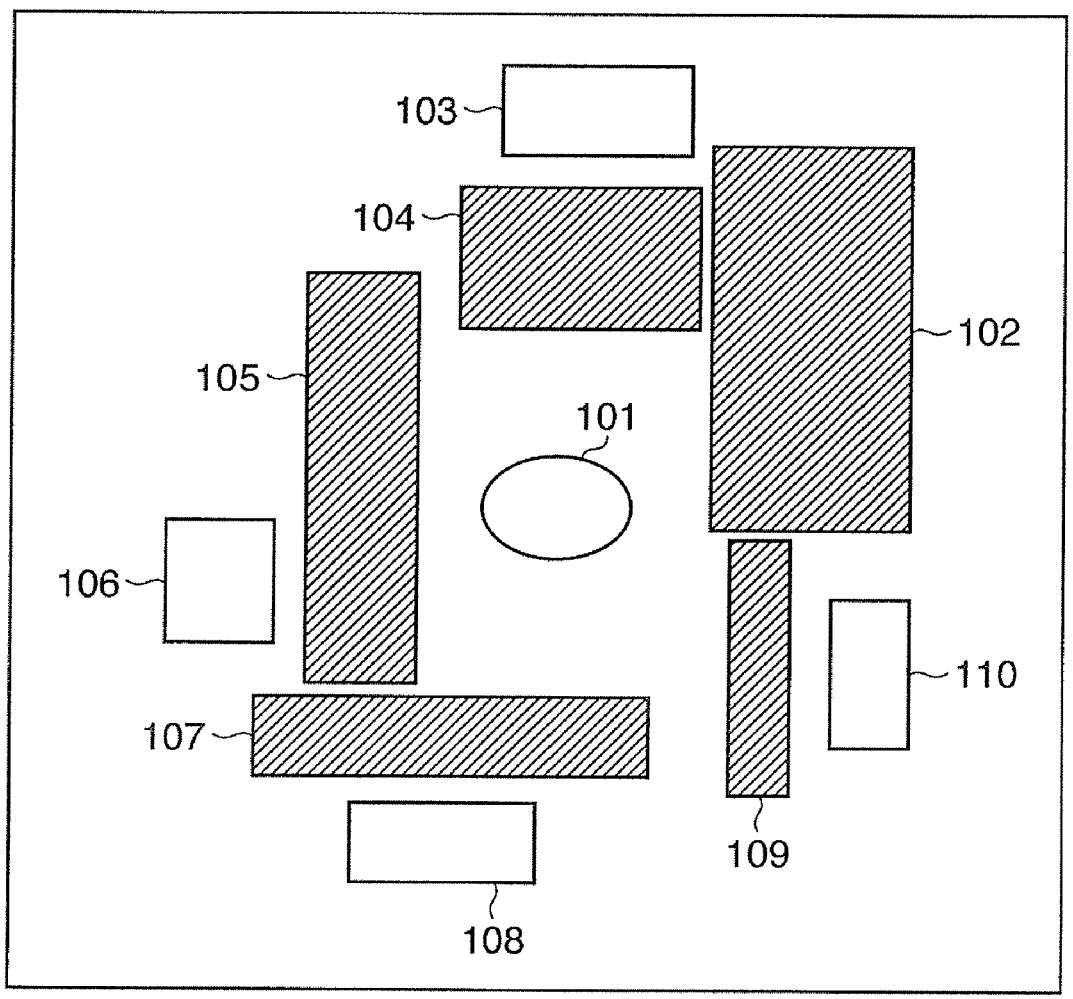
FIG. 1 is a sectional view of virtual space in which virtual objects of a plurality of components including a manipulation target virtual object are laid out.

FIG. 1 is a sectional view of virtual space in which virtual objects of a plurality of components including a manipulation target virtual object are laid out. Referring to FIG. 1, virtual objects 102, 104, 105, 107, and 109 simulating machine components are laid out around a manipulation target virtual object 101. Virtual objects 103, 106, 108, and 110 simulating machine components are further laid out around them.

In this layout, for example, when the manipulation target virtual object 101 is moved to be attached to the virtual object 103, the manipulation target virtual object 101 may collide against (contact) the virtual object 104. When the manipulation target virtual object 101 is moved to be attached to the virtual object 106, the manipulation target virtual object 101 may collide against (contact) the virtual object 105. When the manipulation target virtual object 101 is moved to be attached to the virtual object 108, the manipulation target virtual object 101 may collide against (contact) the virtual object 107. When the manipulation target virtual object 101 is moved to be attached to the virtual object 110, the manipulation target virtual object 101 may collide against (contact) the virtual object 102 or 109.

In moving the manipulation target virtual object 101 to attaching it to one of the virtual objects 103, 106, 108, and 110, the virtual objects 102, 104, 105, 107, and 109 are collision determination targets with respect to the manipulation target virtual object 101.

When not all but some of the virtual objects laid out in the virtual space are set as collision determination targets, the whole process of causing the user to experience the virtual space can be done at a higher speed.

In this embodiment, of all virtual objects existing in the virtual space, a virtual object serving as a collision determination target with respect to the manipulation target virtual object 101 is selected based on the layout relationship between the manipulation target virtual object 101 and the remaining virtual objects. This reduces the number of virtual objects as collision determination targets with respect to the manipulation target virtual object 101.

The following explanation will be done assuming that the virtual objects except the manipulation target virtual object are still objects. "Still" indicates that the position, orientation, and size in the virtual space do not change.

Figure 2:
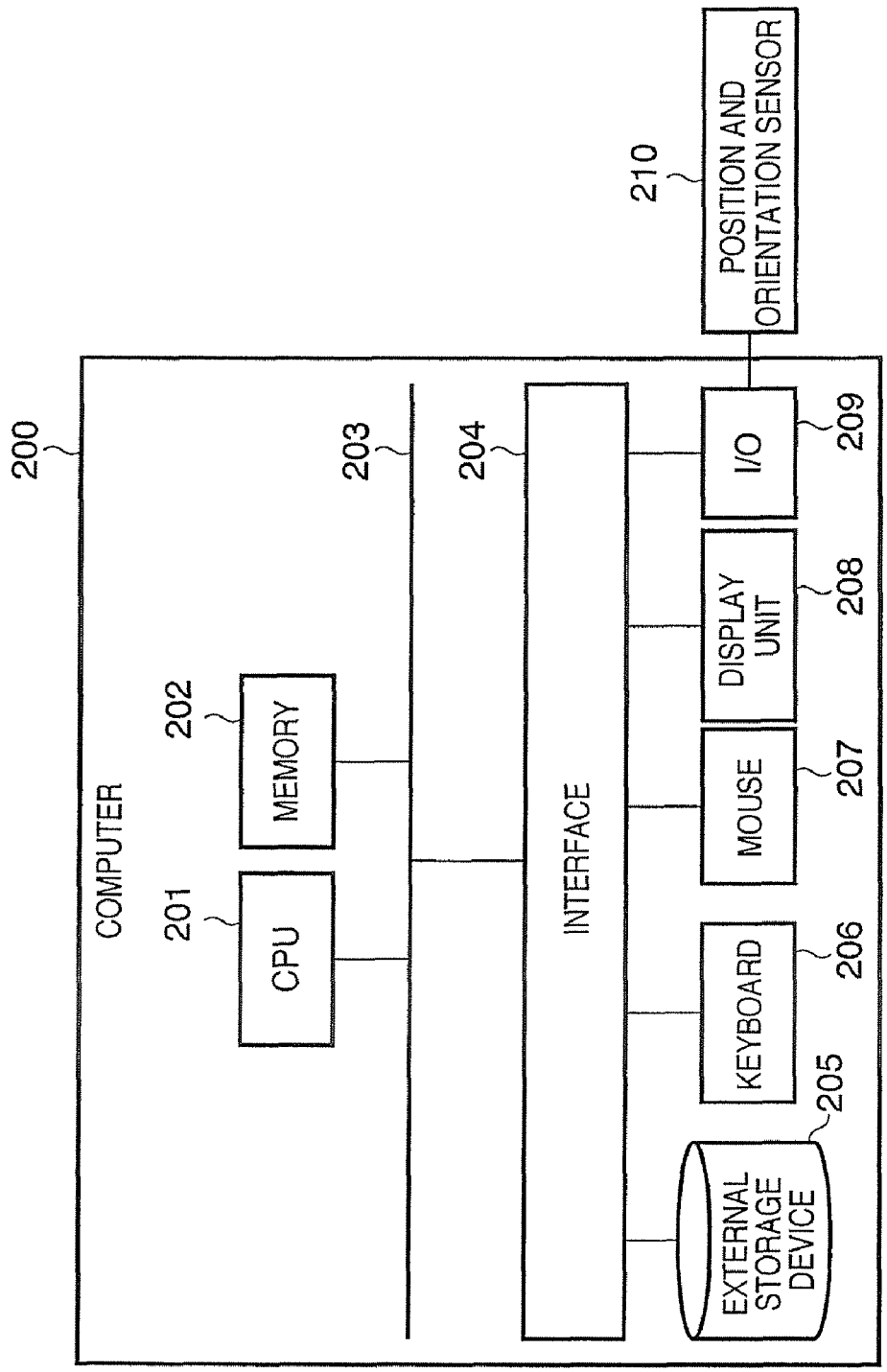
FIG. 2 is a block diagram showing the hardware configuration of a system according to the first embodiment of the present invention.

FIG. 2 is a block diagram showing the hardware configuration of a system according to this embodiment. As shown in FIG. 2, the system of this embodiment includes a computer 200 and a position and orientation sensor 210.

The position and orientation sensor 210 will be described. The position and orientation sensor 210 measures the position and orientation of its own and outputs the measurement result to the computer 200 as data. A magnetic sensor, optical sensor, or ultrasonic sensor is usable as the position and orientation sensor 210. For example, Fastrak available from Polhemus can be used. However, the present invention is not limited to this, and an arbitrary sensor capable of measuring six degrees of freedom is usable.

The user can hold the position and orientation sensor 210 by hand and freely change its position and orientation. The position and orientation of the position and orientation sensor 210 are reflected on those of the manipulation target virtual object, as will be described later. That is, the user can freely control the position and orientation of the manipulation target virtual object by using the position and orientation sensor 210.

The computer 200 will be described next.

A CPU 201 controls the overall computer 200 by using programs and data stored in a memory 202 and executes processes to be described later as processes of the computer 200.

The memory 202 has an area to temporarily store programs and data loaded from an external storage device 205 and position and orientation data acquired from the position and orientation sensor 210. The memory 202 also has a work area to be used by the CPU 201 to execute various kinds of processes. That is, the memory 202 can provide various kinds of areas as needed. Reference numeral 203 denotes a bus.

The external storage device 205 saves an OS (Operating System) and programs and data to cause the CPU 201 to execute processes to be described later as processes of the computer 200. Various kinds of information saved in the external storage device 205 are loaded to the memory 202 as needed under the control of the CPU 201 and processed by it.

A keyboard 206 and mouse 207 are examples of pointing devices to input various kinds of instructions to the CPU 201. Any other device is also usable.

A display unit 208 including a CRT or liquid crystal screen can display a process result by the CPU 201 as an image or text.

An I/O 209 connects the position and orientation sensor 210 to the computer 200. Position and orientation data from the position and orientation sensor 210 is output to the memory 202 or external storage device 205 via the I/O 209.

The external storage device 205, keyboard 206, mouse 207, display unit 208, and I/O 209 connect to an interface 204. The bus 203 also connects to the interface 204.

A process of specifying a virtual object as a collision determination target with respect to the manipulation target virtual object which is moved in the virtual space will be described next with reference to FIG. 3 that shows the flowchart of the processing. The external storage device 205 stores the program and data to cause the CPU 201 to execute the processing corresponding to the flowchart in FIG. 3. The program and data are loaded to the memory 202 as needed under the control of the CPU 201. The CPU 201 executes the processing by using the loaded program and data so that the computer 200 executes the process in each step to be described below.

In step S300, data about the manipulation target virtual object and other virtual objects are loaded from the external storage device 205 to the memory 202.

Figure 4:
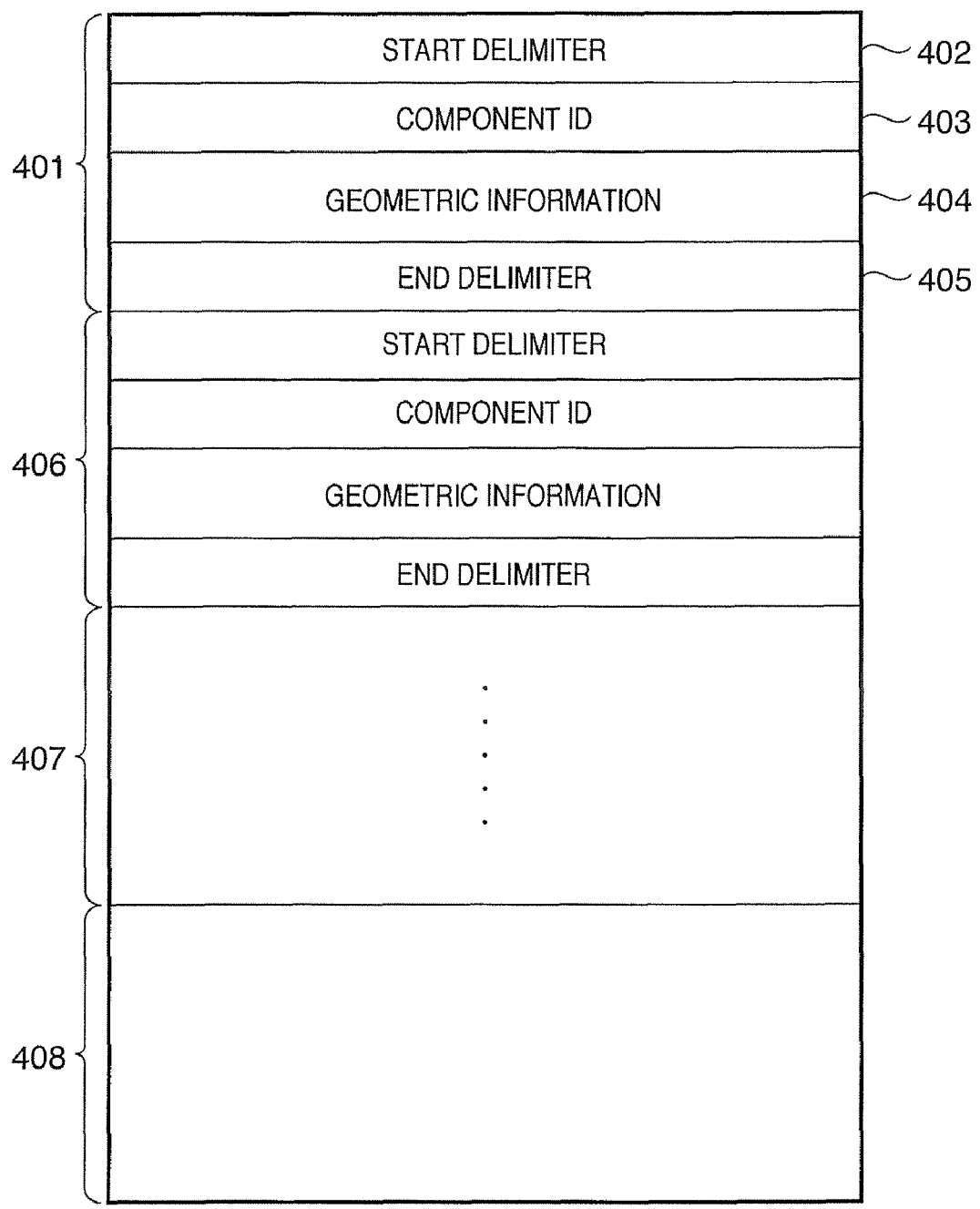
FIG. 4 is a view showing a structural example of data of virtual objects.

FIG. 4 is a view showing a structural example of data of virtual objects. A geometric model includes at least one "component" serving as a geometric element. Model data is described by arranging component data. In this embodiment, each of the manipulation target virtual object and the virtual objects except it simulates one component.

For example, assume that the geometric model has n components. Referring to FIG. 4, the data of the first component is registered in an area 401. The data of the second component is registered in an area 406. The data of the third to (n−1)th components are registered in an area 407. The data of the nth component is registered in an area 408. That is, the data of the virtual object of each component is registered in a corresponding area.

Data about a virtual object (virtual object 1) corresponding to the first component will be explained by exemplifying the area 401.

An area 402 stores a start delimiter indicating the start position of the data about virtual object 1. Similarly, an area 405 stores an end delimiter indicating the end position of the data about virtual object 1. An area 403 stores identification information (component ID) unique to virtual object 1. Any other identification information is also usable. For example, an integral value that changes from one component to another or a character string representing a component name that changes from one component to another may be used as the identification information. An area 404 stores the geometric shape information of virtual object 1. For example, if virtual object 1 is made of polygons, the area 404 stores the position data of each vertex of polygons, the color data of each polygon, the normal data of each polygon, and texture data if texture mapping is necessary. The area 404 also stores the layout position and orientation of virtual object 1 in the virtual space.

In this way, each area stores data about a virtual object.

Figure 3:
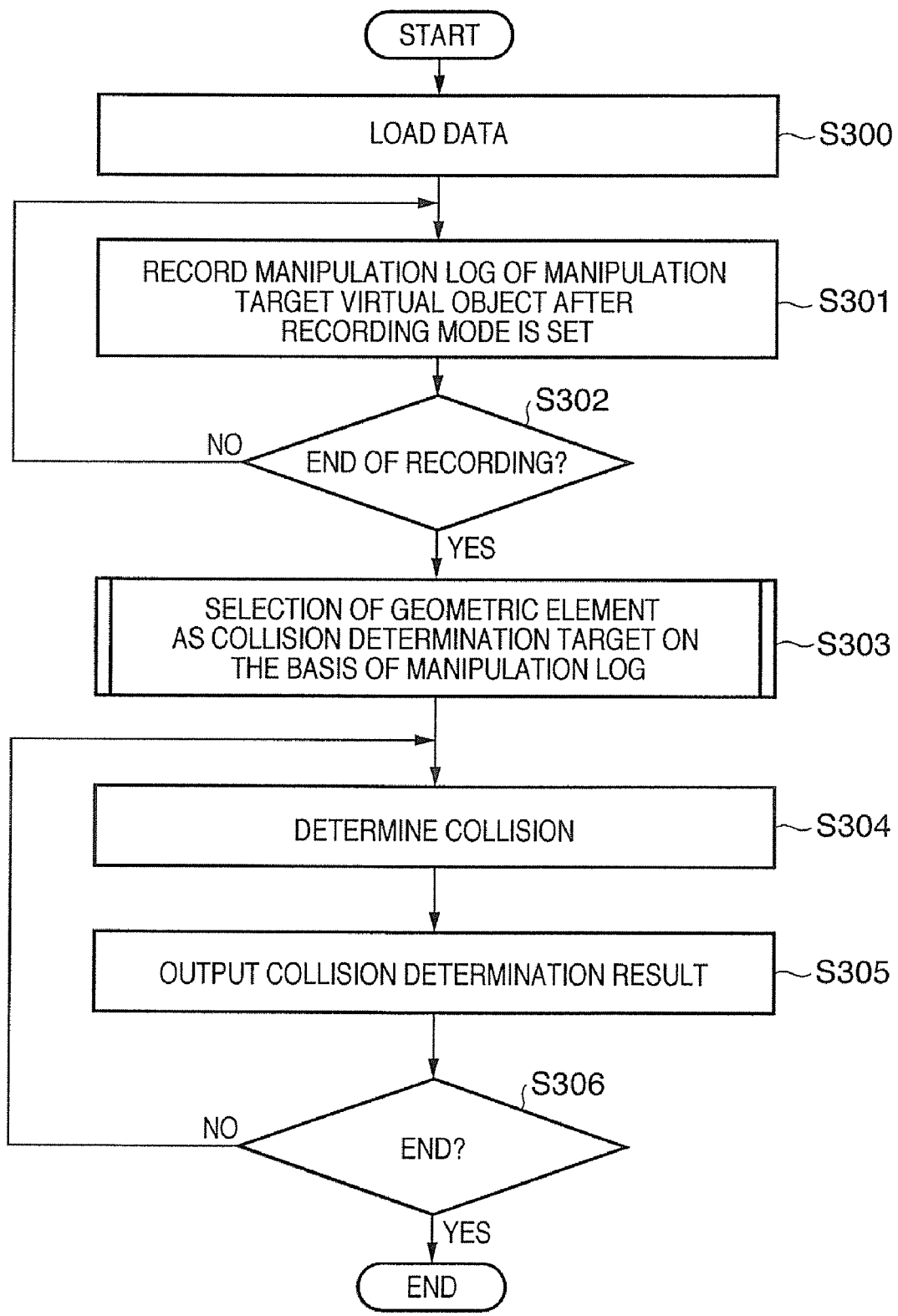
FIG. 3 is a flowchart of a process of specifying a virtual object as a collision determination target with respect to a manipulation target virtual object which is moved in the virtual space.

In rendering processing executed in parallel to the processing corresponding to the flowchart in FIG. 3, the image of the virtual object group is generated by using the geometric shape information and displayed on the display screen of the display unit 208. To generate the image of the virtual object group, each virtual object is laid out in the virtual space based on corresponding geometric shape information (layout position and orientation). Then, the image of the virtual space seen from a set viewpoint is generated. The position and orientation of the viewpoint are instructed by using the keyboard 206 or mouse 207.

The viewpoint position and orientation instruction is not limited to this. For example, if the display unit 208 is installed in a known HMD (Head Mounted Display), a position and orientation measured by a position and orientation sensor attached near the eyes of the user who is wearing the HMD may be used as the viewpoint position and orientation.

Note that the technique of generating a virtual space image seen from a set viewpoint is known, and a detailed description thereof will be omitted.

Referring back to FIG. 3, after the images of the virtual objects are displayed, the user inputs an instruction to set a recording mode by using the keyboard 206 or mouse 207. In step S301, therefore, a recording mode is set in accordance with the input instruction. Simultaneously with the setting of the recording mode, the CPU 201 initializes a "recording time" (to be described later) to "0" and starts counting the recording time.

After the recording mode is set, the user holds the position and orientation sensor 210 and moves it to move the manipulation target virtual object to a desired position while observing the virtual space displayed on the display screen of the display unit 208. As described above, the position and orientation sensor 210 outputs its position and orientation data measured by itself to the memory 202 via the I/O 209. The CPU 201 lays out the manipulation target virtual object in the position and orientation based on the position and orientation data. In step S301, the position and orientation of the center of gravity of the manipulation target virtual object are recorded in the memory 202 as a manipulation log at every predetermined time ($\Delta t$) after the start of counting processing.

The positional relationship between the layout position of the manipulation target virtual object and the position of the center of gravity of the manipulation target virtual object is fixed. The positional relationship is measured in advance and registered in the external storage device 205 as an offset. Hence, in step S301, the offset is added to the position and orientation based on the position and orientation data obtained from the position and orientation sensor 210. The sum is obtained as the position and orientation of the center of gravity of the manipulation target virtual object. The set of the sum and current recording time is registered in the memory 202 as a manipulation log.

While the recording mode is being set, the collision between the manipulation target virtual object and another virtual object is not determined.

In step S302, to finish the recording processing, it is checked whether the user has input a recording mode cancel instruction by using the keyboard 206 or mouse 207. If the recording mode is not canceled, the process returns to step S301 to repeat the process of recording the position and orientation of the center of gravity of the manipulation target virtual object at each $\Delta t$.

If the recording mode cancel instruction is input, the process advances to step S303. At this point in time, the memory 202 has recorded the position of the center of gravity of the manipulation target virtual object 101 at a recording time 0, that at a recording time $\Delta t$, that at a recording time $2\Delta t$, . . . .

In step S303, a virtual object serving as a collision determination target with respect to the manipulation target virtual object is selected from the virtual objects laid out in the virtual space based on the manipulation log. The process in this step will be described later in detail.

In step S304, the collision between the manipulation target virtual object and the virtual object selected in step S303 is determined. The collision determination processing is a known technique, and a description thereof will be omitted. In step S305, for the virtual object that collides against the manipulation target virtual object, the data loaded in step S300 is referred to, and the component ID in the data is output to the memory 202 or external storage device 205. The method of handling the component ID is not particularly limited. For example, in the rendering processing, the virtual object having the component ID output in step S305 is deformed, moved, or rotated by using its geometric shape information. The component ID output destination is not limited to the memory 202 and external storage device 205.

In step S306, it is checked whether the end conditions of the processing are satisfied, or the user has input a processing end instruction by using the keyboard 206 or mouse 207. If the end conditions of the processing are satisfied, or the user has input the processing end instruction by using the keyboard 206 or mouse 207, the processing is ended. If the end conditions of the processing are not satisfied, or the user has not input the processing end instruction by using the keyboard 206 or mouse 207, the process returns to step S304 to repeat the processing from then on.

Figure 7:
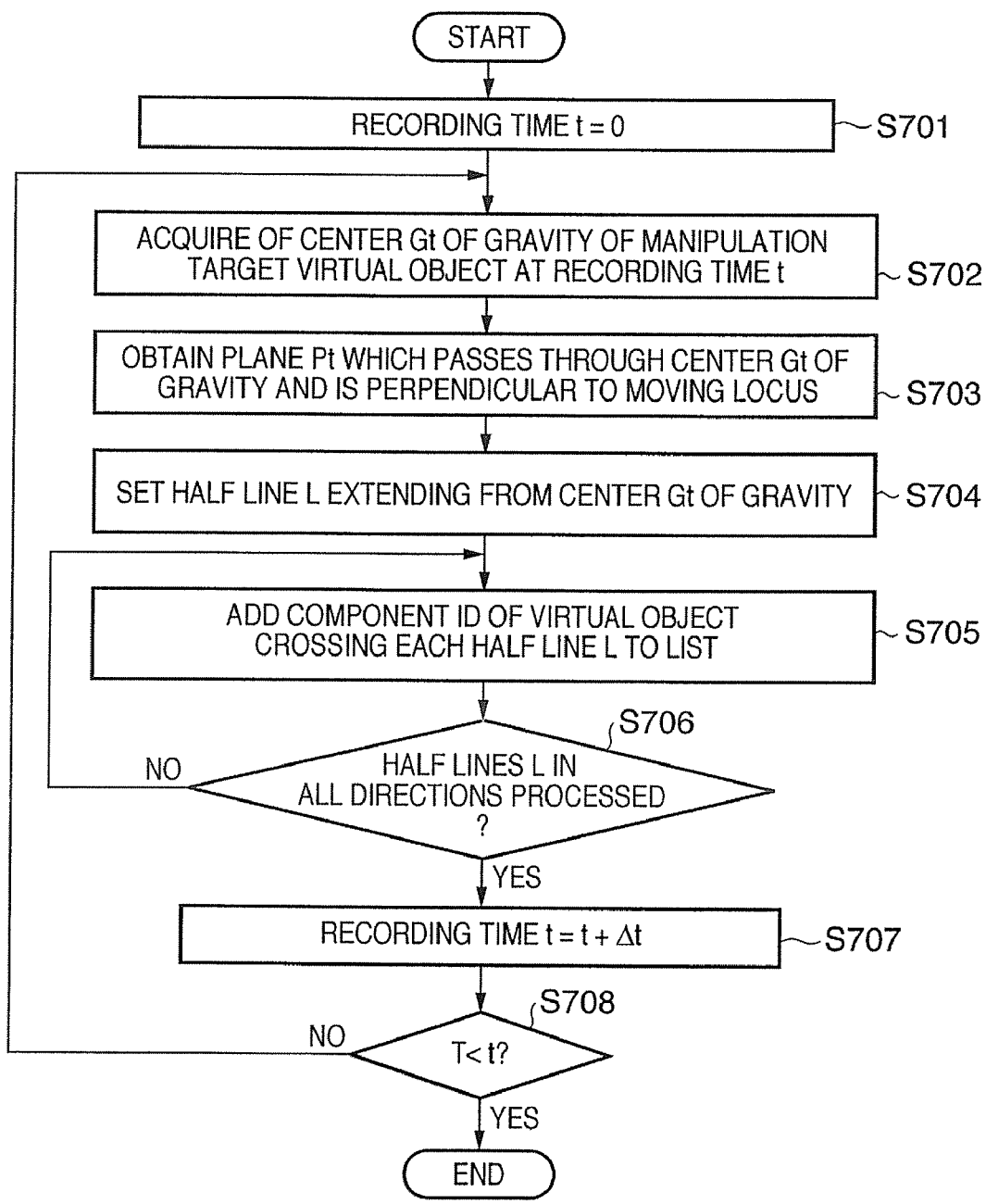
FIG. 7 is a flowchart illustrating the details of a process in step S303.

Details of the process in step S303 will be described next. FIG. 7 is a flowchart illustrating the details of the process in step S303.

In step S701, a variable t representing a recording time is initialized to 0. In step S702, a position Gt of center of gravity of the manipulation target virtual object at the recording time t is acquired by referring to the manipulation log.

In step S703, a plane Pt which includes the position Gt of center of gravity and is perpendicular to the moving locus of the center of gravity of the manipulation target virtual object near the recording time t is obtained. Various methods are available to obtain the plane Pt.

For example, the orientation of the manipulation target virtual object at the position Gt of center of gravity has been recorded in the recording mode. Hence, a plane whose normal vector is defined by the orientation component and which is including the position Gt of center of gravity is obtained as the plane Pt.

Alternatively, for example, A plane whose normal vector is defined by a direction vector from a position Gt(t−Δt) of center of gravity toward a position Gt(t+Δt) of center of gravity and which is including the position Gt of center of gravity is obtained as the plane Pt. In this case, when a recording time f=0 to F, a plane P0 at a position G0 of center of gravity is obtained in the following way. A direction vector from the position G0 of center of gravity toward a position GΔt of center of gravity is defined as a normal vector. A plane including the position G0 of center of gravity is obtained as the plane P0. A plane PF at a position GF of center of gravity is obtained in the following way. A direction vector from a position G(F−Δt) of center of gravity toward the position GF of center of gravity is defined as a normal vector. A plane including the position GF of center of gravity is obtained as the plane PF. The method of obtaining a plane perpendicular to the moving locus is not limited to those described above, as a matter of course.

Figure 5:
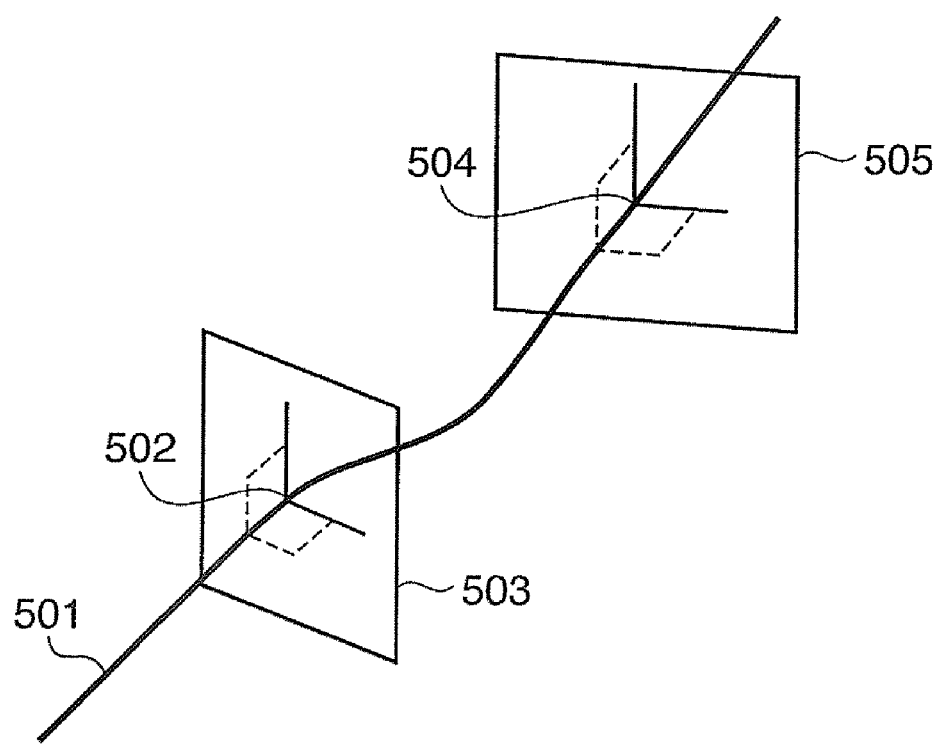
FIG. 5 is a view showing a plane Pt at each position Gt of center of gravity.

FIG. 5 is a view showing the plane Pt at each position Gt of center of gravity. Referring to FIG. 5, reference numeral 501 denotes a moving locus of the center of gravity of the manipulation target virtual object passing through each position Gt of center of gravity; 502 and 504, positions Gt of center of gravity at the recording times. A plane 503 includes the position 502 of center of gravity and has, as the normal vector, the direction vector of the moving locus 501 at this position. A plane 505 includes the position 504 of center of gravity and has, as the normal vector, the direction vector of the moving locus 501 at this position.

In this embodiment, a plane is calculated for each of the recording times t=0, Δt, 2Δt, . . . recorded in the manipulation log. A plane at an arbitrary recording time may be calculated. In this case, a curve passing through the position of center of gravity at each of the recording times t=0, Δt, 2Δt, . . . is obtained by using, e.g., spline interpolation. Then, a plane which includes a point at an arbitrary position on the curve and has, as the normal vector, the direction vector of the curve at this point is obtained. The present invention is not limited to this method, as a matter of course.

Referring back to FIG. 7, in step S704, an equation of a half line L on the plane Pt, which extends from the position Gt of center of gravity, is calculated. A plurality of half lines L radially extending from the position Gt of center of gravity are obtained.

In step S705, one of the plurality of half lines L obtained in step S704 is selected, and the component ID of the virtual object that crosses the selected half line L first is specified. The specified component ID is registered in a list used to registering the component IDs of virtual objects as collision determination targets with respect to the manipulation target virtual object. The list is held in the memory 202.

Figure 6:
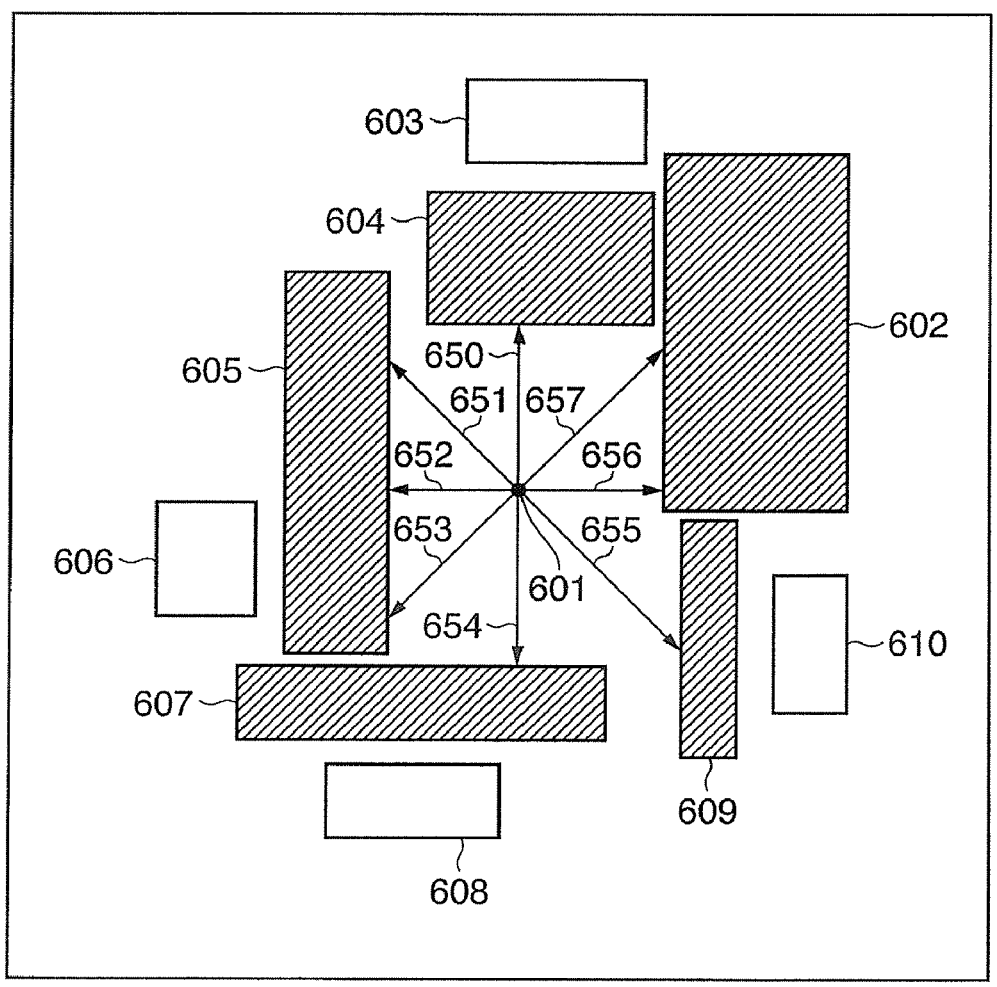
FIG. 6 is a sectional view of virtual space based on the plane Pt.

FIG. 6 is a sectional view of virtual space based on the plane Pt. In FIG. 6, reference numeral 601 denotes the position Gt of center of gravity; 602 to 610, virtual objects except the manipulation target virtual object; and 650 to 657, half lines on the plane Pt, which extend from the position Gt of center of gravity. Referring to FIG. 6, eight half lines are obtained. That is, the angle between the half lines is 45°. However, the present invention is not limited to this. The angle between the half lines may be decreased by increasing the number of half lines. Alternatively, the angle between the half lines may be increased by decreasing the number of half lines.

In the example shown in FIG. 6, the eight half lines are obtained in step S704. In step S705, a virtual object first crossing each half line from the position Gt of center of gravity is specified, and the component ID of the specified virtual object is registered in the list.

For, for example, the half line 650, the virtual object 604 crosses the half line 650 first. In this case, the component ID of the virtual object 604 is registered in the list. For the half line 651, the virtual object 605 crosses the half line 651 first. In this case, the component ID of the virtual object 605 is registered in the list. For the half lines 652 and 653, the virtual object 605 crosses the half lines 652 and 653 first. However, component ID registration in the list is not executed because the component ID of the virtual object 605 is already registered in the list.

When this processing is done for all half lines, the component IDs of the virtual objects 602, 604, 605, 607, and 609 are registered in the list, and those of the remaining virtual objects are not registered in the list. That is, the virtual objects except the virtual objects 602, 604, 605, 607, and 609 are not included in the collision determination targets with respect to the manipulation target virtual object.

In this way, a virtual object crossing each half line first is specified, and the component ID of the specified virtual object is registered in the list. The virtual objects having the component IDs registered in the list are included in the collision determination targets with the manipulation target virtual object in step S304.

Detection of a virtual object crossing a line in step S705 can be implemented by using, for example, a scene graph library Open Inventor available from Mercury.

Referring back to FIG. 7, it is checked in step S706 whether the process in step S705 is executed for all the plurality of half lines obtained in step S704. If NO in step S706, the process returns to step S705 to select one of the unprocessed half lines and specify the component ID of the virtual object that crosses the selected half line L first.

If all half lines are processed, the process advances to step S707. In step S707, Δt is added to the variable t. In step S708, it is checked whether the time represented by the variable t is earlier (less) than an end time T of the recording processing in step S301. If t>T, the processing is ended. If t≦T, the process returns to step S702 to repeat the processing from then on.

As described above, according to this embodiment, it is possible to reduce the number of virtual objects as the collision determination targets with respect to the manipulation target virtual object. This allows speeding up the collision determination processing and also the whole process of causing the user to experience the virtual space.

In the recording mode, no collision determination is executed. This reduces the processing load.

These effects facilitate the operator's interactive operation.

In place of the position of center of gravity of the manipulation target virtual object in the above description, the position of center of a solid such as a rectangular parallelepiped including the manipulation target virtual object may be used.

In this embodiment, all virtual objects which cross the half lines extending from the position of center of gravity of the manipulation target virtual object are included in the collision determination targets with respect to the manipulation target virtual object. Instead, of all virtual objects which cross the half lines extending from the position of center of gravity of the manipulation target virtual object, those arranged within a predetermined distance from the position of center of gravity of the manipulation target virtual object may be included in the collision determination targets with respect to the manipulation target virtual object.

Instead of selecting a virtual object crossing one half line, a virtual object crossing at least a predetermined number of half lines may be selected as the collision determination target with respect to the manipulation target virtual object.

In this embodiment, after setting the recording mode, the position and orientation of the center of gravity of the manipulation target virtual object at each Δt and the recording time are recorded as a set in the manipulation log. However, every time the position of center of gravity of the manipulation target virtual object moves by a predetermined distance, its position and orientation and the recording time may be recorded as a set in the manipulation log.

In this embodiment, while the recording mode is being set, the collision between the manipulation target virtual object and another virtual object is not determined. However, in the recording mode, collision determination processing may be executed by using a method simpler than that after cancel of the recording mode. In the recording mode, the component ID of a virtual object that collides against the manipulation target virtual object may be registered in the list.

Second Embodiment

Only points different from the first embodiment will be described below.

Figure 8:
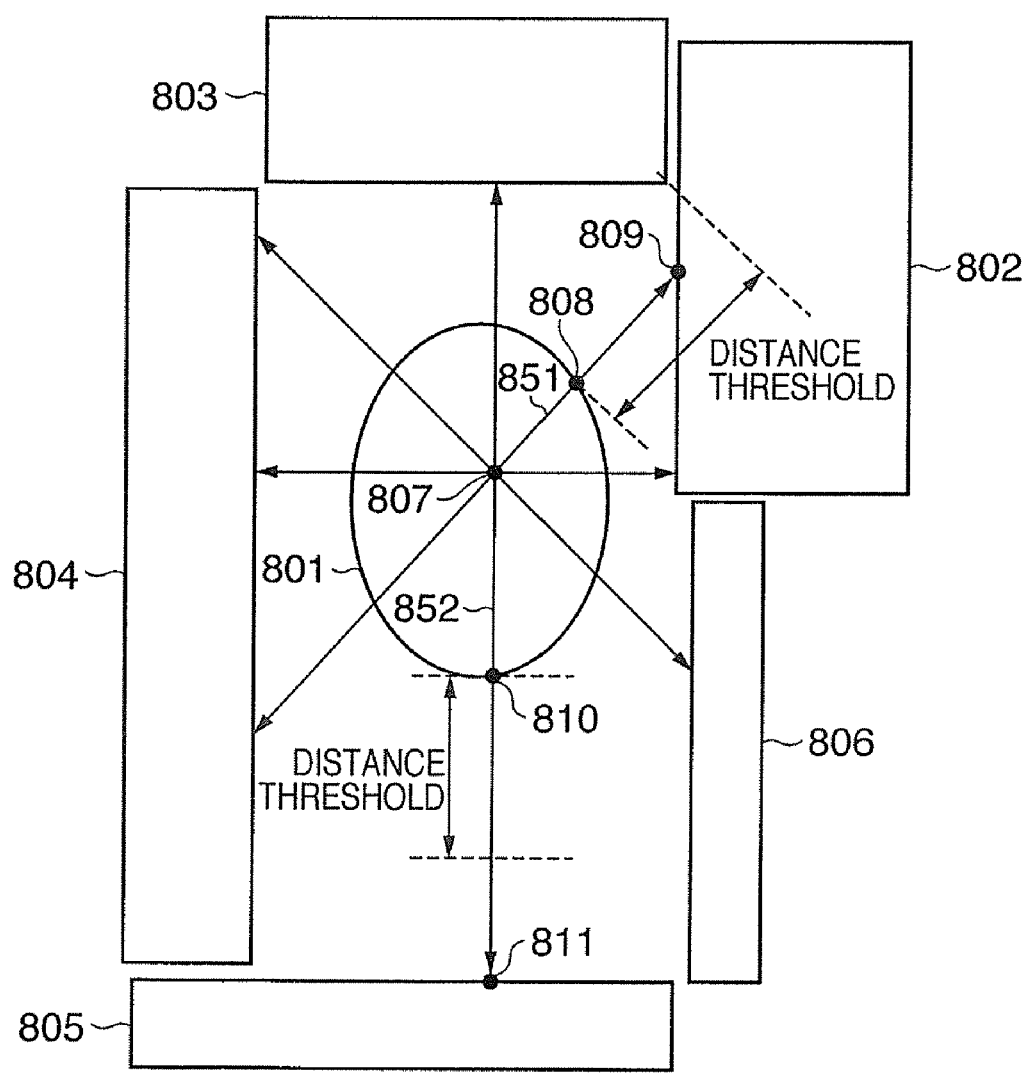
FIG. 8 is a sectional view of virtual space based on a plane Pt.

FIG. 8 is a sectional view of virtual space based on a plane Pt. In the second embodiment, the process of selecting a virtual object as a collision determination target with respect to the manipulation target virtual object is different from the first embodiment in the points to be described below.

Referring to FIG. 8, reference numeral 801 denotes a manipulation target virtual object; 802 to 806, virtual objects except the manipulation target virtual object; and 807, a position of center of gravity of the manipulation target virtual object.

In this embodiment, half lines radially extending from the position of center of gravity of the manipulation target virtual object are set, as in the first embodiment. In this embodiment, however, next to the half line setting, the position of each point where a half line crosses the manipulation target virtual object and the position of each point where a half line crosses a virtual object except the manipulation target virtual object are obtained. For example, a half line 851 crosses the manipulation target virtual object at a point 808 and crosses a virtual object except it at a point 809. Next, the distance between the two points is obtained. In FIG. 8, the distance between the points 808 and 809 is obtained. If the obtained distance is equal to or smaller than a distance threshold, the virtual object is selected as a collision determination target with respect to the manipulation target virtual object. Since the distance between the points 808 and 809 in FIG. 8 is smaller than the distance threshold, the virtual object 802 is selected as a collision determination target with respect to the manipulation target virtual object.

On the other hand, for a half line 852, since the distance between a point 810 where the half line 852 crosses the manipulation target virtual object and a point 811 where the half line 852 crosses the virtual object 805 is not less than the distance threshold, the virtual object 805 is not selected as a collision determination target with respect to the manipulation target virtual object.

In this embodiment, the distance between an intersection where a half line extending from the position of center of gravity of the manipulation target virtual object crosses the manipulation target virtual object and an intersection where the half line crosses a virtual object is obtained. If the obtained distance is equal to or smaller than the threshold, the virtual object is selected as a collision determination target with respect to the manipulation target virtual object.

If the manipulation target virtual object already collides against another virtual object, the distance (distance between intersections where the half line crosses each virtual objects) between the virtual object and manipulation target virtual object has a minus sign. This always makes the distance between intersections equal to or smaller than the distance threshold. For this reason, a virtual object that collides against the manipulation target virtual object is always selected as a collision determination target.

In this embodiment, to specify a virtual object as a collision determination target with respect to the manipulation target virtual object which is moved in the virtual space, processing corresponding to the flowchart in FIG. 3 is executed. Only the process in step S303 is different from the first embodiment.

FIG. 9 is a flowchart of the process in step S303 according to this embodiment. The same step numbers as in FIG. 7 denote the same processes in FIG. 9, and a description thereof will be omitted.

In step S901, one of the plurality of half lines set in step S704 is selected, and a farthest point M from a position Gt of center of gravity is selected from the intersections between the selected half line and the manipulation target virtual object. In step S902, a virtual object crossing the half line is specified from the plurality of virtual objects except the manipulation target virtual object. The component ID of the specified virtual object and the coordinate position of one of the intersections, which is closest to the point M, are stored as a set in a memory 202.

In step S903, referring to the coordinate position in at least one set stored in the memory 202 in step S902, a component ID paired with a coordinate position whose distance from the point M is smaller than a distance threshold is specified. The specified component ID is registered in a list for registering the component IDs of virtual objects as collision determination targets with respect to the manipulation target virtual object, as in the first embodiment.

The above-described processing enables to select a collision determination target with respect to the manipulation target virtual object in consideration of its size. It is possible to further speed up the whole processing because only virtual objects which collide against the manipulation target virtual object at a high probability can be selected as the collision determination targets.

The distance threshold may be either a predetermined fixed value or a value set by the user using a keyboard 206 or mouse 207 as needed.

Third Embodiment

In the first and second embodiments, a collision determination target with respect to the manipulation target virtual object is selected by using a manipulation log obtained by recording processing of one cycle in the recording mode. Instead, the collision determination target with respect to the manipulation target virtual object may be selected by using a plurality of manipulation logs obtained by a plurality of number of times of recording processing.

In this case, the first or second embodiment is applied to each manipulation log. With this processing, the collision determination target is selected while reflecting more variations of the way the manipulation target virtual object moves. It is therefore possible to prevent omission of determination that occurs when the collision determination targets are limited.

Alternatively, the number of times each virtual object except the manipulation target virtual object is selected as a collision determination target is counted by some method.

Virtual objects whose count value is equal to or larger than a predetermined value may finally be selected as collision determination targets with respect to the manipulation target virtual object. In this case, any virtual object near a locus which the manipulation target virtual object rarely passes through is excluded from collision determination target selection. It is therefore possible to efficiency limit the collision determination targets.

The number of times of recording processing need not always be fixed and may be changed.

Fourth Embodiment

In the second embodiment, for each half line, the distance between the manipulation target virtual object and a still object is compared with the threshold. Instead, for each component of a still object, the average of the distances between each component and the manipulation target virtual object is calculated. A component whose average distance is smaller than a predetermined threshold is selected as a collision determination target.

Additionally, as described in the third embodiment, a plurality of manipulation logs obtained by a plurality of number of times of recording processing are used. An average distance for each manipulation log is obtained. Furthermore, the average distance (second average distance) of the average distances obtained for all manipulation logs is obtained. A virtual object having a distance equal to or smaller than the second average distance is selected as a collision determination target with respect to the manipulation target virtual object.

According to this arrangement, if the manipulation target virtual object rarely passes near a virtual object, the virtual object is excluded from collision determination target selection. It is therefore possible to efficiency limit the collision determination targets.

Fifth Embodiment

In the above-described embodiments, the unit of collision determination with respect to the manipulation target virtual object is a virtual object. However, a constituent element of a virtual object may be selected as a collision determination target. For example, when a virtual object is formed from polygons, the unit of collision determination with respect to the manipulation target virtual object may be a polygon.

For example, in the first embodiment, a polygon including a point crossing a half line is selected as a collision determination target with respect to the manipulation target virtual object.

This arrangement further limits the range of collision determination targets and speeds up collision determination processing.

The user may set the unit of collision determination with respect to the manipulation target virtual object, a virtual object main body or constituent element, by using a keyboard 206 or mouse 207 as needed.

Sixth Embodiment

To visually distinguish between a virtual object (constituent element) selected as a collision determination target with respect to the manipulation target virtual object and an unselected virtual object (constituent element), the former and latter may be displayed in different ways. For example, the display color may be changed between them. The former may be rendered as an opaque object while the latter may be rendered as a translucent object. Alternatively, only the former may be displayed with a red wire frame superimposed on a plane patch.

Seventh Embodiment

In the above-described embodiments, virtual objects except the manipulation target virtual object stand still. However, the present invention is not limited to this. The position, orientation, and size may change as needed.

In this case, in the recording mode, the position, orientation, and enlargement/reduction ratio (enlargement/reduction ratio relative to the original size) of each virtual object are recorded as a set in addition to the position and orientation of center of gravity of the manipulation target virtual object and the recording time.

In selecting a "collision determination target with respect to the manipulation target virtual object" at a recording time t, the position, orientation, and size of each virtual object are changed based on its position, orientation, and enlargement/reduction ratio at the recording time t. Then, the "process of selecting a collision determination target with respect to the manipulation target virtual object" described in the above embodiments is executed.

In the recording mode, the enlargement/reduction ratio of the manipulation target virtual object may be recorded as a set in addition to its position and orientation of center of gravity and the recording time, as a matter of course. In selecting a "collision determination target with respect to the manipulation target virtual object" at the recording time t, the size of the manipulation target virtual object is changed based on its enlargement/reduction ratio at the recording time t. Then, the "process of selecting a collision determination target with respect to the manipulation target virtual object" described in the above embodiments is executed. This arrangement allows changing the size of the manipulation target virtual object as needed.

The number of manipulation target virtual objects need not always be one. A plurality of manipulation target virtual objects may be set. In this case, the above-described embodiments are applied to each manipulation target virtual object.

The above-described embodiments may be combined as needed.

Other Embodiments

The object of the present invention is also achieved by the following method. A recording medium (or storage medium) which records software program codes to implement the functions of the above-described embodiments is supplied to a system or an apparatus. The computer (or CPU or MPU) of the system or apparatus reads out and executes the program codes stored in the recording medium. In this case, the program codes read out from the recording medium themselves implement the functions of the above-described embodiments. The recording medium that records the program codes constitutes the present invention.

The computer executes the readout program codes, and the operating system (OS) running on the computer partially or wholly executes actual processing based on the instructions of the program codes, thereby implementing the functions of the above-described embodiments.

The program codes read out from the recording medium are written in the memory of a function expansion card inserted into the computer or a function expansion unit connected to the computer. The CPU of the function expansion card or function expansion unit partially or wholly executes actual processing based on the instructions of the program codes, thereby implementing the functions of the above-described embodiments.

The recording medium to which the present invention is applied stores program codes corresponding to the above-described flowcharts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-236757, filed Aug. 31, 2006, which is hereby incorporated by reference herein in its entirety.

The invention claimed is:

1. An information processing method, using a computer to perform:
   a recording step of recording, in a memory, a manipulation log about a manipulation target virtual object;
   a selection step of selecting, on the basis of the manipulation log recorded in the recording step, a virtual element as a collision determination target with respect to the manipulation target virtual object from a plurality of virtual elements existing in the same virtual space as the manipulation target virtual object;
   a collision determination step of determining collision between the manipulation target virtual object and the selected virtual element; and
   an output step of outputting a result of the collision determination step,
   wherein, in the recording step, a position of the manipulation target virtual object is included in the manipulation log at a predetermined time interval from a start of recording to an end of recording.

2. The method according to claim 1, wherein the recording step includes a step of recording, in the memory, the manipulation log about the manipulation target virtual object in a recording mode which is set in accordance with a user instruction.

3. The method according to claim 1, wherein
   the manipulation log indicates a moving locus of the manipulation target virtual object, and
   in the selection step, a virtual element existing near the moving locus is selected as the collision determination target.

4. The method according to claim 1, wherein, in the selection step, a virtual element located near each position recorded in the recording step is selected as the collision determination target.

5. The method according to claim 1, wherein a virtual element is a virtual object other than the manipulation target virtual object and a constituent unit of the virtual object.

6. The method according to claim 5, wherein when the virtual object is formed from polygons, and the constituent unit is a polygon.

7. The method according to claim 1, wherein the recording step includes a step of recording, in the memory, the manipulation log about a manipulation target virtual object in a recording mode, and said method further comprising:
   a second collision determination step of determining collision between the manipulation target virtual object and the plurality of virtual elements in the recording mode by a method which requires a smaller processing load than the collision determination processing executed in the collision determination step; and
   a second output step of outputting a result of the second collision determination step.

8. An information processing apparatus comprising:
   a recording unit which records, in a memory, a manipulation log about a manipulation target virtual object;
   a selection unit which selects, on the basis of the manipulation log recorded by the recording unit, a virtual element as a collision determination target with respect to the manipulation target virtual object from a plurality of virtual elements existing in the same virtual space as the manipulation target virtual object;
   a collision determination unit which determines collision between the manipulation target virtual object and the selected virtual element; and
   an output unit which outputs a result from the collision determination unit,
   wherein the recording unit includes a position of the manipulation target virtual object in the manipulation log at a predetermined time interval from a start of recording to an end of recording.

9. A non-transitory computer-readable storage medium storing, in executable form, a program which causes a computer to execute the information processing method of claim 1.

10. The method according to claim 1, wherein the recording step includes a step of recording, in the memory, the manipulation log about a manipulation target virtual object in a recording mode.

11. An information processing method, using a computer to perform:
   a recording step of recording, in a memory, a manipulation log about a manipulation target virtual object;
   a selection step of selecting, on the basis of the manipulation log recorded in the recording step, a virtual element as a collision determination target with respect to the manipulation target virtual object from a plurality of virtual elements existing in the same virtual space as the manipulation target virtual object;
   a collision determination step of determining collision between the manipulation target virtual object and the selected virtual element; and
   an output step of outputting a result of the collision determination step,
   wherein, in the recording step, a position of the manipulation target virtual object is included in the manipulation log at a predetermined distance interval from a start of recording to an end of recording.

12. The method according to claim 11, wherein, in the selection step, a virtual element located near each position included in the recording step is selected as the collision determination target.

13. An information processing apparatus comprising:
   a recording unit which records, in a memory, a manipulation log about a manipulation target virtual object;
   a selection unit which selects, on the basis of the manipulation log recorded by the recording unit, a virtual element as a collision determination target with respect to the manipulation target virtual object from a plurality of virtual elements existing in the same virtual space as the manipulation target virtual object;
   a collision determination unit which determines collision between the manipulation target virtual object and the selected virtual element; and
   an output unit which outputs a result from the collision determination unit,
   wherein the recording unit includes a position of the manipulation target virtual object in the manipulation log at a predetermined distance interval from a start of recording to an end of recording.

14. A non-transitory computer-readable storage medium storing, in executable form, a program which causes a computer to execute the information processing method of claim 11.

15. An information processing method, using a computer to perform:
- a recording step of recording, in a memory, a manipulation log about a manipulation target virtual object;
- a selection step of selecting, on the basis of the manipulation log recorded in the recording step, a virtual element as a collision determination target with respect to the manipulation target virtual object from a plurality of virtual elements existing in the same virtual space as the manipulation target virtual object;
- a collision determination step of determining collision between the manipulation target virtual object and the selected virtual element;
- an output step of outputting a result of the collision determination step; and
- a display control step of causing a display device to display the manipulation target virtual object and virtual elements except the manipulation target virtual object,
- wherein, in the display control step, the virtual element selected in the selection step and an unselected virtual element are displayed by different display methods.

16. An information processing apparatus comprising:
- a recording unit which records, in a memory, a manipulation log about a manipulation target virtual object;
- a selection unit which selects, on the basis of the manipulation log recorded by the recording unit, a virtual element as a collision determination target with respect to the manipulation target virtual object from a plurality of virtual elements existing in the same virtual space as the manipulation target virtual object;
- a collision determination unit which determines collision between the manipulation target virtual object and the selected virtual element;
- an output unit which outputs a result from the collision determination unit; and
- a display control unit which causes a display device to display the manipulation target virtual object and virtual elements except the manipulation target virtual object,
- wherein the display control unit displays the virtual element selected by the selection unit and an unselected virtual element by different display methods.

17. A non-transitory computer-readable storage medium storing, in executable form, a program which causes a computer to execute the information processing method of claim 15.

* * * * *